(12) United States Patent
Lee et al.

(10) Patent No.: US 9,175,387 B2
(45) Date of Patent: Nov. 3, 2015

(54) METHOD FOR FABRICATING TWO DIMENSIONAL NANOSTRUCTURED TUNGSTEN CARBIDE

(71) Applicant: KOREA INSTITUTE OF SCIENCE AND TECHNOLOGY, Seoul (KR)

(72) Inventors: Wook Seong Lee, Seoul (KR); Hak Joo Lee, Incheon (KR); Young Joon Baik, Seoul (KR); Jong Keuk Park, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 120 days.

(21) Appl. No.: 13/746,185

(22) Filed: Jan. 21, 2013

(65) Prior Publication Data

US 2013/0273395 A1  Oct. 17, 2013

(30) Foreign Application Priority Data

Apr. 13, 2012 (KR) ........................ 10-2012-0038556

(51) Int. Cl.
  *C23C 16/32* (2006.01)
  *H05H 1/24* (2006.01)
  *C23C 16/448* (2006.01)

(52) U.S. Cl.
  CPC ............. *C23C 16/32* (2013.01); *C23C 16/4488* (2013.01)

(58) Field of Classification Search
  CPC ................................... C23C 16/32; H05H 1/24
  USPC .................. 427/249.1, 249.4, 249.17, 249.18
  See application file for complete search history.

(56) References Cited

U.S. PATENT DOCUMENTS

| | | | |
|---|---|---|---|
| 6,369,508 B1* | 4/2002 | Lochschmidt | 313/558 |
| 2006/0193978 A1* | 8/2006 | Toth | 427/212 |
| 2007/0160866 A1* | 7/2007 | Nitta et al. | 428/660 |
| 2008/0081127 A1* | 4/2008 | Thompson et al. | 427/569 |
| 2009/0117372 A1* | 5/2009 | Zhuk et al. | 428/336 |
| 2011/0051220 A1* | 3/2011 | Lee | 359/275 |
| 2013/0295387 A1 | 11/2013 | Baik et al. | |

FOREIGN PATENT DOCUMENTS

| | | |
|---|---|---|
| KR | 1020040019693 A | 3/2004 |
| KR | 1020040060182 A | 7/2004 |
| KR | 1020110138898 A | 12/2011 |
| KR | 10-1165329 B1 | 7/2012 |

OTHER PUBLICATIONS

Shi, Xiaoliang, et al., "Synthesis of multi-walled carbon nanotube-tungsten carbide composites by the reduction and carbonization process". Carbon 45 (2007) pp. 1735-1742.*
Yan, Zaoxue, et al., "Nanosized tungsten carbide synthesized by a novel route at low temperature for high performance electrocatalysis". Scientific Reports 3: 1646 pp. 1-7.*
Du, Changhai, et al., Tungsten carbide catalyst supported on carbon nanotube for the hydrogenation of cellulose. Advanced Materials Research vols. 236-238 (2011) pp. 432-436.*
Arie, Takayuki, et al., "Growth of tungsten carbide nano-needle and its application as a scanning tunnelling microscope tip". J. Phys. D: Appl. Phys. 31 (1996) L49-L51.*
Mohapatra, Dipti Ranjan, et al., "A novel structure of tungsten carbide nanowalls grown on nanocrystalline diamond film". CrystEngComm, 2012, 14, 2222-2228.*
Takayuki Arie, et al; "Rapid Communication: Growth of tungsten carbide nano-needle and its application as a scanning tunnelling microscope tip", J. Phys. D: Appl. Phys. vol. 31, No. 14, pp. L49-L61; Jul. 21, 1998.
Hak-Joo Lee, et al; "Ultrananocrystalline diamond film deposition by direct-current plasma assisted chemical vapor deposition using hydrogen-rich precursor gas in the absence of the positive column", Journal of Applied Physics, vol. 109, pp. 023303-1-023303-9, published online Jan. 21, 2011.

* cited by examiner

Primary Examiner — Bret Chen
(74) Attorney, Agent, or Firm — Ladas & Parry LLP

(57) ABSTRACT

2-dimensional nanostructured tungsten carbide which is obtained by control of the alignment of nanostructure during growth of tungsten carbide through control of the degree of supersaturation and a method for fabricating same are disclosed. The method for fabricating 2-dimensional nanostructured tungsten carbide employs a chemical vapor deposition process wherein a hydrogen plasma is applied to prepare 2-dimensional nanostructured tungsten carbide vertically aligned on a nanocrystalline diamond film. The chemical vapor deposition process wherein the hydrogen plasma is applied includes: disposing a substrate with the nanocrystalline diamond film formed thereon on an anode in a chamber, disposing a surface-carburized tungsten cathode above and at a distance from the substrate, and applying the hydrogen plasma into the chamber.

7 Claims, 7 Drawing Sheets

METHOD FOR FABRICATING TWO DIMENSIONAL NANOSTRUCTURED TUNGSTEN CARBIDE

CROSS-REFERENCE TO RELATED APPLICATION

This application claims priority to Korean Patent Application No. 10-2012-0038556, filed on Apr. 13, 2012, and all the benefits accruing therefrom under 35 U.S.C. §119, the contents of which in its entirety are herein incorporated by reference.

BACKGROUND

1. Field

Embodiments relate to 2-dimensional nanostructured tungsten carbide and a method for fabricating same. More particularly, embodiments relate to 2-dimensional nanostructured tungsten carbide of various shapes, particularly tungsten carbide of nanowall structure, obtained by control of the alignment of nanostructure during growth of tungsten carbide through control of the degree of supersaturation and a method for fabricating same.

2. Description of the Related Art

Nanostructured materials have attracted great interest in various nanotechnology applications due to their outstanding physical and chemical properties. Great efforts have been directed to the synthesis of specifically aligned nanostructured materials to exploit their properties varying with their geometrical alignment. Recently, vertically aligned 2-dimensional nanostructures, so-called nanowalls, of carbon, zinc oxide (ZnO) and cobalt oxide ($Co_3O_4$) have been reported. Further, it is known that NiO nanowalls are electrochemically superior to NiO nanoparticles.

Due to high aspect ratio, short diffusion length for mass and charge transport and high in-plane continuity on a substrate, nanowall structures are ideal for lithium batteries, energy storage media, field electron emitters, and so forth.

Tungsten carbide (WC) has been widely adopted in various fields due to high melting point, superior hardness, low friction coefficient, high oxidation resistance and superior electrical conductivity. Recently, it was reported that nanostructured tungsten carbide has platinum (Pt)-like catalytic properties in chemisorption of hydrogen and oxygen. Hence, it has a potentially of replacing the expensive platinum catalyst.

Currently, there are few researches on the synthesis of nanostructured tungsten. Synthesis of nanometer-sized WC needles on a tungsten tip by catalytic deposition (T. Arie, S. Akita and Y. J. Nakayama, *J. Phys. D: Appl. Phys.*, 1998, 31, L49) was the first report and synthesis of WC nanotubes by thermal decomposition and synthesis of $WC_2$ nanowires by thermal annealing of $WC_x$ films under nitrogen atmosphere were reported.

However, the nanostructured tungsten carbide materials fabricated by these methods have 1-dimensional structures. Vertically aligned 2-dimensional nanostructures of tungsten carbide, i.e. nanowall structures of tungsten carbide, have not been reported to date.

SUMMARY

Embodiments are directed to providing 2-dimensional nanostructured tungsten carbide of various shapes, particularly tungsten carbide of nanowall structure, obtained by control of the alignment of nanostructure during growth of tungsten carbide through control of the degree of supersaturation and a method for fabricating same.

According to an aspect, embodiments provide a method for fabricating 2-dimensional nanostructured tungsten carbide vertically aligned on a nanocrystalline diamond film by a chemical vapor deposition process wherein a hydrogen plasma is applied.

The chemical vapor deposition process wherein the hydrogen plasma is applied includes: disposing a substrate with the nanocrystalline diamond film formed thereon on an anode in a chamber, disposing a surface-carburized tungsten cathode above and at a distance from the substrate, and applying the hydrogen plasma into the chamber.

The geometric shape of the tungsten carbide formed on the nanocrystalline diamond film is determined by the degree of supersaturation at a growth front. The tungsten carbide grows into a nanowall structure when the degree of supersaturation is relatively lower and grows into a thin film structure when the degree of supersaturation is relatively higher.

The degree of supersaturation is determined by the influx of growth species. The degree of supersaturation increases when the influx of the growth species is relatively higher and decreases when the influx of the growth species is relatively lower. And, the influx of the growth species is controlled by controlling temperature and/or discharge voltage and current required for generation of the hydrogen plasma.

The surface-carburized tungsten cathode is obtained by exposing a tungsten cathode to a carbon atmosphere of a predetermined temperature such that a carburized layer is formed up to a predetermined depth from the surface. The carburized layer has a $WC_x$ structure.

According to another aspect, embodiments provide 2-dimensional nanostructured tungsten carbide vertically aligned on a nanocrystalline diamond film, which is formed by a chemical vapor deposition process wherein the hydrogen plasma is applied. The chemical vapor deposition process wherein the hydrogen plasma is applied includes: disposing a substrate with the nanocrystalline diamond film formed thereon on an anode in a chamber, disposing a surface-carburized tungsten cathode above and at a distance from the substrate, and applying the hydrogen plasma into the chamber.

BRIEF DESCRIPTION OF THE DRAWINGS

The above and other objects, features and advantages of the present disclosure will become apparent from the following description of certain exemplary embodiments given in conjunction with the accompanying drawings, in which.

DETAILED DESCRIPTION

Figure 1:
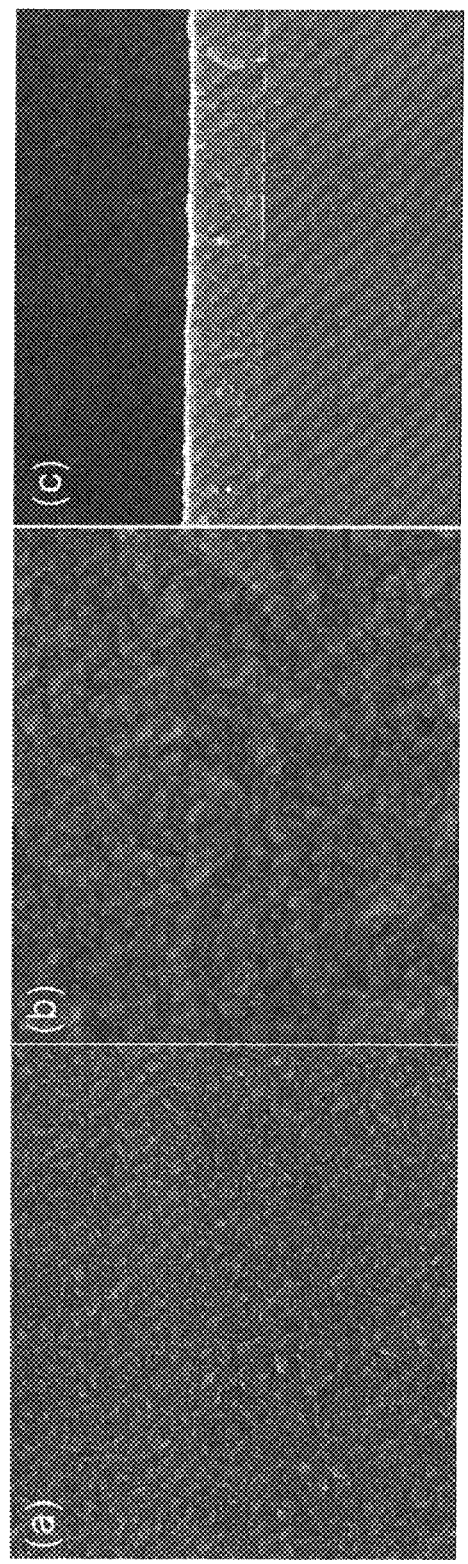
FIG. 1 shows scanning electron microscope (SEM) images of a nanocrystalline diamond (NCD) film grown on a silicon substrate in Example 1.

Hereinafter, exemplary embodiments will be described in detail with reference to the accompanying drawings.

Embodiments relate to fabrication of tungsten carbide (WC) having a 2-dimensional nanostructure on a nanocrystalline diamond (NCD) film. As used herein, the 2-dimensional nanostructure refers to a nanowall structure aligned vertically with respect to the plane of a substrate.

The nanowall-structured tungsten carbide is formed by a chemical vapor deposition process wherein a hydrogen plasma is applied. Specifically, an anode on which a substrate is placed is disposed in a chemical vapor deposition chamber and a tungsten cathode is disposed above and at a distance from the substrate. When electrical power is applied to the anode and the cathode while supplying hydrogen into the chamber, a hydrogen plasma is generated. The tungsten cathode and the nanocrystalline diamond serve as the supply sources of growth species, i.e., tungsten and carbon atoms, and nanowall-structured tungsten carbide is formed on the nanocrystalline diamond film.

To summarize, in order to form the nanowall-structured tungsten carbide according to the embodiments, 1) the chemical vapor deposition process and 2) the application of the hydrogen plasma during the chemical vapor deposition process are required.

During the chemical vapor deposition process, the growth species (tungsten and carbon atoms) are supplied from the tungsten cathode and the nanocrystalline diamond and the nanowall-structured tungsten carbide is formed on the nanocrystalline diamond as described above.

Although the nanocrystalline diamond film serves in part as a source of carbon atoms during the formation of the nanowall-structured tungsten carbide, carbon should be supplied to the nanocrystalline diamond film from above to obtain a vertically aligned nanowall structure. For this purpose, it is necessary to use a surface-carburized tungsten cathode. The surface-carburized tungsten cathode is obtained by carburizing a tungsten cathode such that a carburized layer is formed up to a predetermined depth from the surface. The carburized layer comprises $WC_x$ and may be formed by exposing the tungsten cathode to a methane gas atmosphere of a predetermined temperature. The surface-carburized tungsten cathode, precisely the carburized layer, serves as the source of both tungsten and carbon atoms during the formation of the nanowall-structured tungsten carbide.

During the chemical vapor deposition process, a hydrogen plasma is applied. Through physicochemical interaction with the surface-carburized tungsten cathode, the hydrogen plasma transfers the tungsten and carbon atoms from the carburized layer of the tungsten cathode to the nanocrystalline diamond film.

The chemical vapor deposition process according to an embodiment has a similar aspect compared to sputtering which is a commonly employed physical deposition method in that the hydrogen plasma physically contacts with the tungsten cathode. However, whereas the sputtering requires very low pressure in the chamber and argon (Ar) which is heavier than hydrogen is used in the sputtering process, the hydrogen plasma used in the embodiments of the present disclosure exhibits very low sputtering yield due to small mass. Further, since the pressure in the chamber to which the hydrogen plasma is applied is set higher than that for sputtering, the contact of the hydrogen plasma with the tungsten cathode in the embodiments of the present disclosure is not limited to sputtering.

In the foregoing description, the physicochemical interaction between the hydrogen plasma and the tungsten cathode reflects this aspect. In the embodiments of the present disclosure, the hydrogen plasma serves to relax and break the chemical bonding of the tungsten cathode, precisely the carburized layer ($WC_x$), such that the tungsten and carbon atoms of the carburized layer are diffused onto the nanocrystalline diamond film in gas phase. For reference, the relaxation and breaking of the chemical bonding of the carburized layer ($WC_x$) is affected by the temperature in the chamber (600 to 800° C.).

In addition, the fact that the plasma used in the embodiments of the present disclosure comprises pure hydrogen also allows the supply of tungsten and carbon atoms from the carburized layer. According to a report by the inventors of the present disclosure (H. J. Lee, H. Jeon and W. S. Lee, J. Appl. Phys., 2011, 109, 023303), binary alloys were not synthesized under a mixture gas atmosphere of methane and hydrogen due to the inertness of tungsten. Accordingly, it is thought that the use of pure hydrogen plasma without any carbonaceous gas (methane) allows not only the tungsten atoms but also the carbon atoms to be released and transferred from the carburized layer.

Hereinabove, the condition where the tungsten carbide is formed, i.e. the chemical vapor deposition process and the application of the hydrogen plasma, was described. The embodiments relate to fabrication of tungsten carbide having a vertically-aligned 2-dimensional nanostructure, or so-called the nanowall-structured tungsten carbide.

The geometric shape of the tungsten carbide formed on the nanocrystalline diamond film is determined by the degree of supersaturation at a growth front. The tungsten carbide forms a nanowall structure when the degree of supersaturation is relatively lower and forms a thin film structure on the nanocrystalline diamond when the degree of supersaturation is relatively higher.

The degree of supersaturation is determined by the influx of growth species from the carburized layer of the tungsten cathode onto the nanocrystalline diamond film. Accordingly, thin-film type tungsten carbide is formed when the influx of the growth species is relatively higher due to high supersaturation and nanowall-structured tungsten carbide is formed when the influx of the growth species is relatively lower due to low supersaturation.

The influx of the growth species may be determined by two factors: 1) generation rate of the growth species in the carburized layer and 2) diffusion rate of the generated growth species. The factor 1) may be controlled by controlling the discharge voltage and current applied to the anode and the tungsten cathode and the factor 2) may be controlled by controlling the temperature in the chamber. If the discharge voltage and current are high or if the temperature in the chamber is high, the influx of the growth species increases and, as a result, thin-film type tungsten carbide grows at the growth front due to high supersaturation. On the other hand, if the discharge voltage and current are low or if the temperature in the chamber is low, the influx of the growth species decreases and, as a result, nanowall-shaped tungsten carbide grows at the growth front due to low supersaturation.

The reason why the nanowall structure is formed when the degree of supersaturation is relatively low and the thin film structure is formed when the degree of supersaturation is relatively high is as follows.

When the degree of supersaturation is relatively low, secondary nucleation at the growth front is minimized because of low influx of the growth species, resulting in growth of single crystals in vertical direction and formation of the nanowall structure. By contrast, when the degree of supersaturation is relatively high, re-nucleation occurs repeatedly at the growth front owing to high influx of the growth species, leading to hindered growth in vertical direction and formation of the polycrystalline film.

Hereinafter, the method for fabricating 2-dimensional nanostructured tungsten carbide according to embodiments will be described through examples and experiments.

Example 1

Formation of Nanocrystalline Diamond Film on Silicon Substrate

A nanocrystalline diamond (NCD) film was synthesized on a silicon substrate by hot filament chemical vapor deposition (HFCVD). Prior to the HFCVD, the silicon substrate was ultrasonically seeded with nanocrystalline diamond particles (average grain size: 3 nm) dispersed in methanol. A mixture gas of 5% $CH_4$ and 95% $H_2$ was used as a precursor during the HFCVD. The deposition was carried out for 30 minutes at a substrate temperature of 750° C. and a chamber pressure of 7.5 Torr. As a result of the HFCVD, a nanocrystalline diamond (NCD) film having a grain size of 10 to 15 nm and a thickness of 440 nm was formed.

Example 2

Synthesis of Nanowall-Structured Tungsten Carbide

Nanowall-structured tungsten carbide was synthesized on the NCD film prepared through Example 1 using a direct current plasma assisted chemical vapor deposition (DC-PACVD) system.

An anode was disposed in a chamber of the DC-PACVD system, a tungsten disk which served as a substrate holder was put on the anode, and the substrate with the NCD film formed was put on the tungsten disk. A surface-carburized tungsten cathode was disposed above the substrate with a distance of 5 mm from the substrate. The surface-carburized tungsten cathode had been prepared previously by exposing a tungsten cathode to a CVD diamond synthesis environment ($H_2$—$CH_4$ precursor) for a long time. The surface-carburized tungsten cathode had a $WC_x$ structure up to a predetermined depth from the surface.

Tungsten carbide was synthesized under a first condition and a second condition. The first condition was discharge voltage=480 V, discharge current=50 A, cathode temperature=600° C. and substrate temperature=600° C., and the second condition was discharge voltage=473 V, discharge current=50 A, cathode temperature=800° C. and substrate temperature=800° C. Chamber pressure was 100 Torr and processing time was 6 hours for both the first condition and the second condition. Hydrogen plasma was generated by supplying 150 SCCM of hydrogen into the chamber. The hydrogen plasma serves as a driving medium transferring tungsten and carbon atoms from the surface-carburized tungsten cathode and the nanocrystalline diamond to the growth front of tungsten carbide.

Example 3

Experimental Result

FIG. 1 shows scanning electron microscope (SEM) images of the NCD film grown on the silicon substrate according to Example 1. As seen from FIG. 1, the entire surface of the substrate was uniformly covered with the NCD film of an average grain size of about 10 to 15 nm. Referring to FIG. 1 (c), the thickness of the NCD film was 440 nm. FIGS. 1 (a) and (b) are plan-view images of the NCD film at low magnification and high magnification, respectively.

Figure 2:
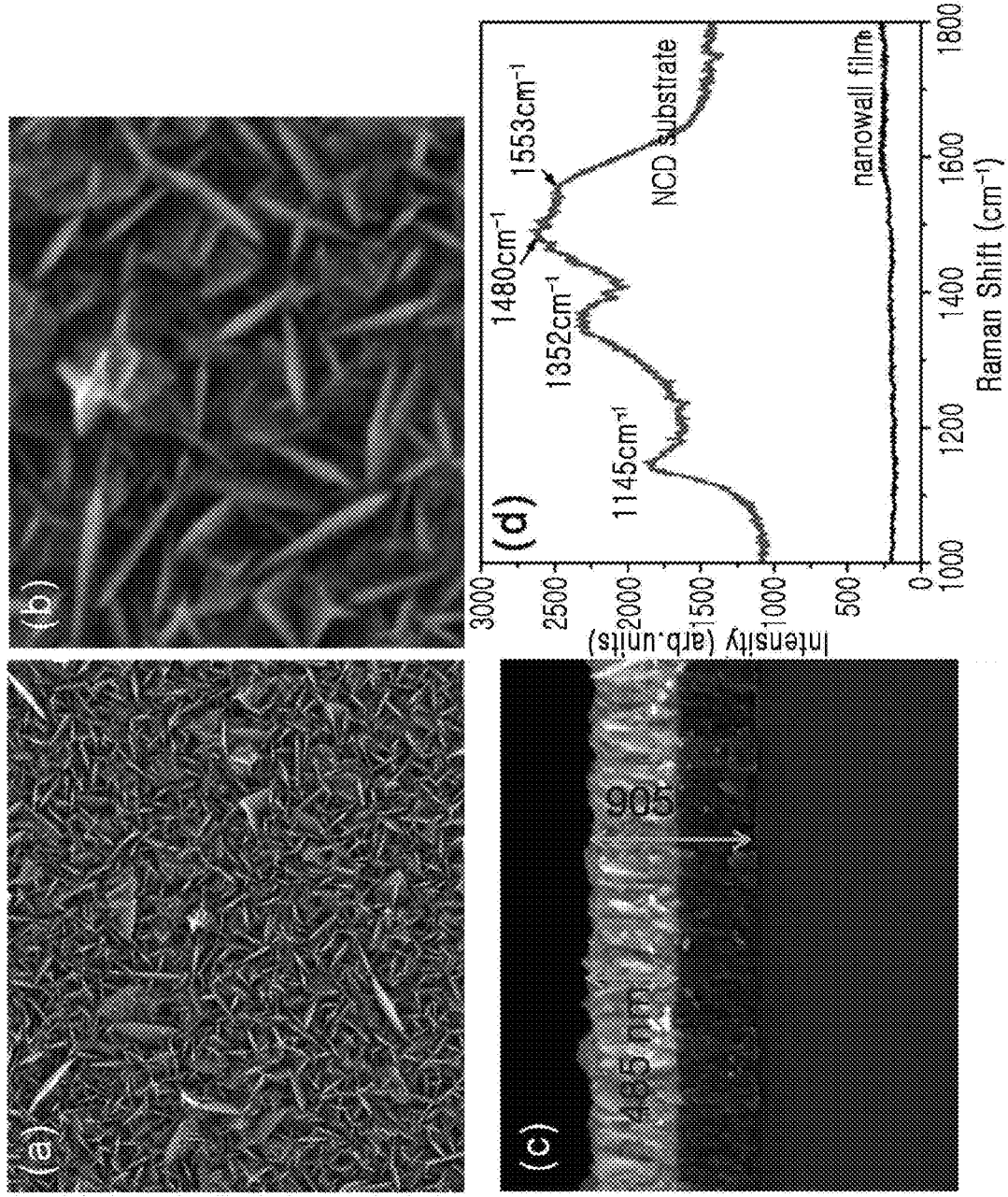
FIG. 2 (*a*) to (*c*) show SEM images of a nanowall-structured tungsten carbide prepared according to a first condition in Example 2 and FIG. 2 (*d*) shows Raman spectra of an NCD film and the nanowall structure.

FIGS. 2 (a) and (b) are plan-view SEM images of the nanowall-structured tungsten carbide prepared according to the first condition in Example 2. As seen from FIGS. 2 (a) and (b), the entire surface of the NCD film was uniformly covered with a layer of the 2-dimensional nanostructure, i.e. the nanowall structure. The synthesized nanowall structure was vertically aligned with respect to the plane of the substrate. The nanowall structure and the NCD film were mutually interconnected to form an extended network. Referring to the cross-sectional SEM image of FIG. 2 (c), a contrast of two different regions, the darker region of about 420 nm in thickness (NCD film) and the brighter region of about 485 nm in thickness (nanowall structure) is shown.

From FIG. 1 and FIG. 2 (c), it can be seen that the thickness of the NCD film decreased by about 20 nm from 440 nm to 420 nm after the formation of the nanowall structure. This indicates that the new layer was formed, at least partially, at the expense of the carbon atoms of the NCD film, probably via etching of the NCD film by the hydrogen plasma and by subsequent synthesis of the new layer, i.e. the nanowall structure, on top of it. This should happen only at the early stage of the nanowall structure growth, i.e. at the nucleation stage, since the growth of the new layer beyond a predetermined thickness would prevent further etching of the NCD film by the plasma.

The structural transformation associated with the formation of the nanowall structure was investigated by Raman spectroscopy. FIG. 2 (d) shows Raman spectra of the NCD film and the nanowall structure recorded using an argon ion laser of an excitation wavelength of 514 nm at room temperature. Referring to FIG. 2 (d), the spectrum for the NCD film shows four main peaks at 1145 $cm^{-1}$, 1352 $cm^{-1}$, 1480 $cm^{-1}$ and 1553 $cm^{-1}$. It is widely known that the peaks at 1145 $cm^{-1}$ and 1480 $cm^{-1}$ originate from the presence of confined phonon modes in diamond and the peaks at 1352 $cm^{-1}$ and 1553 $cm^{-1}$ are attributed to D-mode and G-mode Raman peaks, respectively. By contrast, the Raman spectrum taken from the surface of the nanowall structure was free from any significant peak. This indicates that the major chemical composition of the nanowall structure is not carbon. Accordingly, a further investigation on the chemistry of the nanowall structure may be performed.

Figure 3:
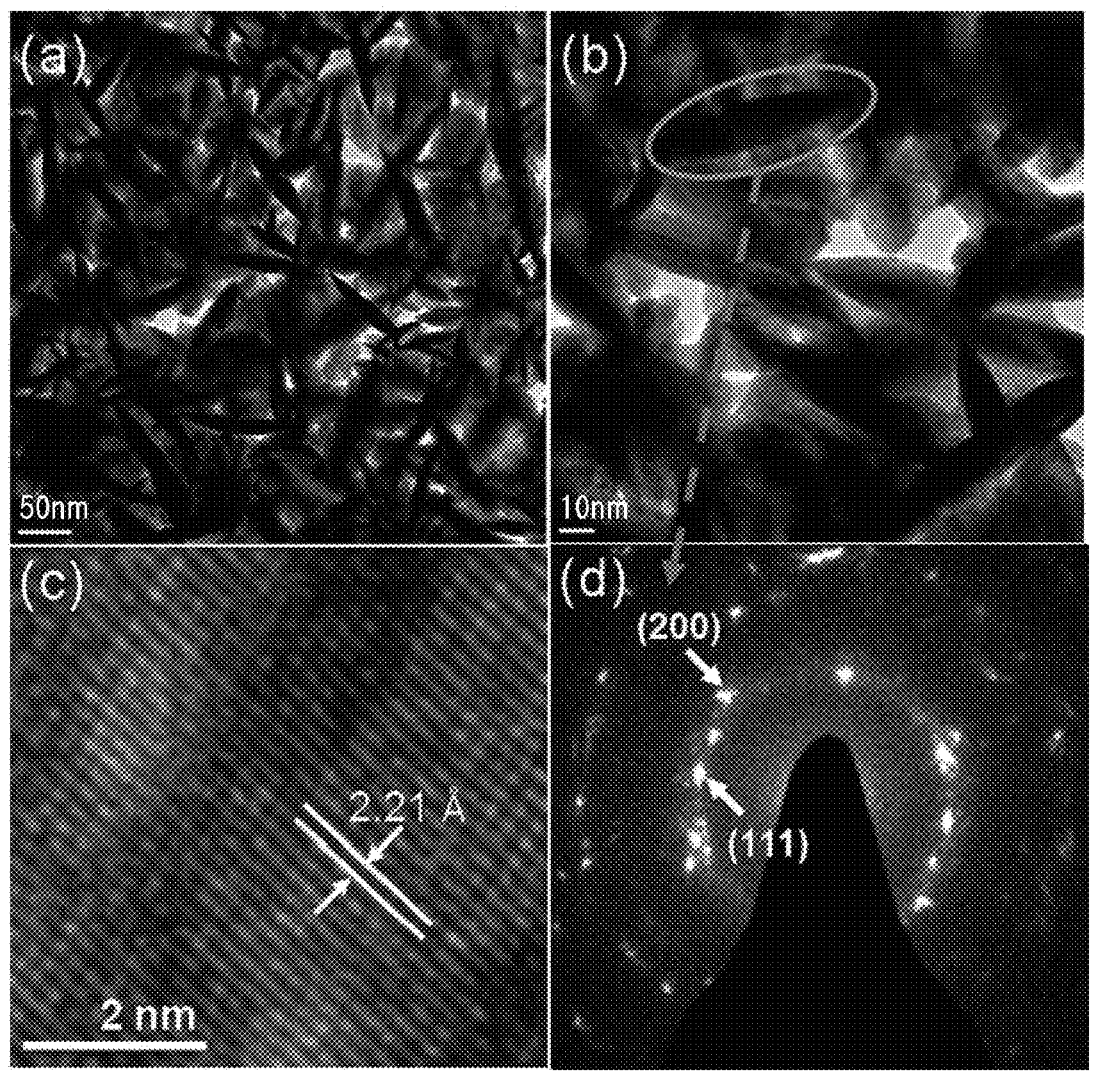
FIGS. 3 (*a*) and (*b*) show plan-view transmission electron microscope (TEM) images of nanowall-structured tungsten carbide formed on an NCD film, FIG. 3 (*c*) shows a plan-view high resolution TEM (HR-TEM) image of nanowall-structured tungsten carbide and FIG. 3 (*d*) shows a selected area electron diffraction (SAED) pattern taken from a single nanowall marked by a circular ring in FIG. 3 (*b*)

FIGS. 3 (a) and (b) show plan-view transmission electron microscope (TEM) images of the nanowall-structured tungsten carbide formed on the NCD film, FIG. 3 (c) shows a plan-view high resolution TEM (HR-TEM) image of the nanowall-structured tungsten carbide and FIG. 3 (d) shows a selected area electron diffraction (SAED) pattern taken from a single nanowall marked by a circular ring in FIG. 3 (b). FIG. 3 (c) reveals a lattice structure with an inter-planar spacing of 2.21 Å, which corresponded to the (200) plane of the $WC_{1-x}$ phase of tungsten carbide. The inter-planar spacings 2.21 Å and 2.42 Å observed in FIG. 3 (d) corresponded to the (200) and (111) planes of the $WC_{1-x}$ phase, respectively.

Figure 4:
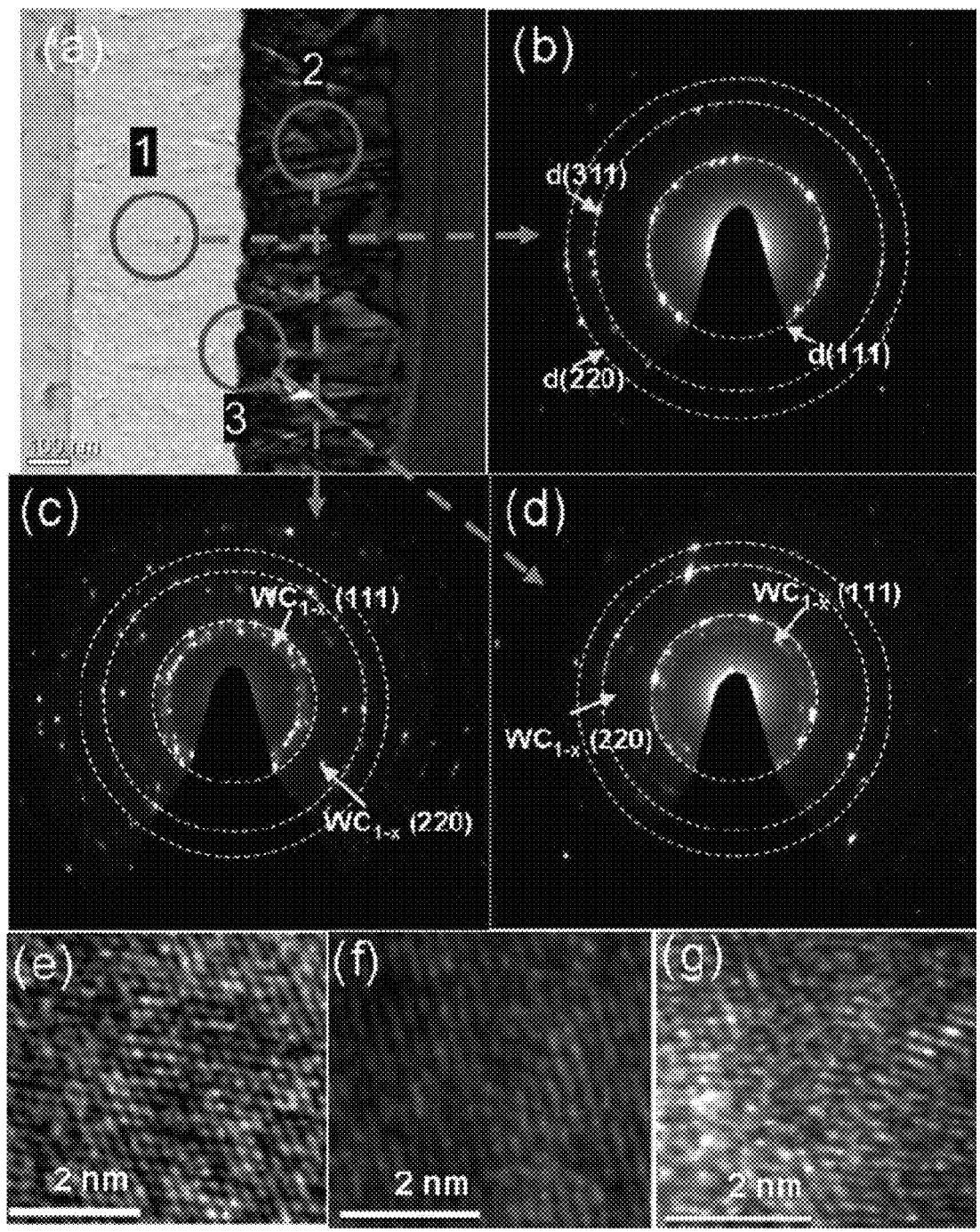
FIG. 4 (*a*) shows a cross-sectional TEM image of nanowall-structured tungsten carbide formed on a substrate, FIG. 4 (*b*) to (*d*) show SAED patterns taken from the respective marked regions (1: NCD, 2: nanowall, 3: NCD/nanowall interface) in FIG. 4 (a) and FIG. 4 (e) to (g) show HR-TEM images of the regions 1, 2 and 3 in FIG. 4 (a)

Cross-sectional HR-TEM and diffraction analyses were carried out for more detailed structural investigation. FIG. 4 (a) shows a cross-sectional TEM image of the nanowall-structured tungsten carbide formed on the substrate. It exhibited two different regions as those observed in the SEM image of FIG. 2 (c). The difference in brightness of the two regions results from the difference in crystalline structure and atomic density. Since tungsten absorbs more electrons than carbon, it appears dark in the TEM image.

FIG. 4 (b) to (d) show SAED patterns taken from the three different regions (1: NCD, 2: nanowall, 3: NCD/nanowall interface) in FIG. 4 (a). The white dotted circles represent the diffracted rings for cubic diamond. The inter-planar spacings 2.42 Å and 1.48 Å correspond to the (111) and (220) planes of the $WC_{1-x}$ phase, respectively. FIG. 4 (e)-(g) show HR-TEM images of the regions 1, 2 and 3 in FIG. 4 (a). The SAED pattern obtained from the nanowall and the interface region further identified the synthesized nanowall-structured tungsten carbide. The cross-sectional image of FIG. 4 (g) shows polycrystalline structure, whereas the plan-view HR-TEM image of FIG. 3 (c) shows single crystalline structure. This indicates that some portion of the nanowall has a polycrystalline structure.

Figure 5:
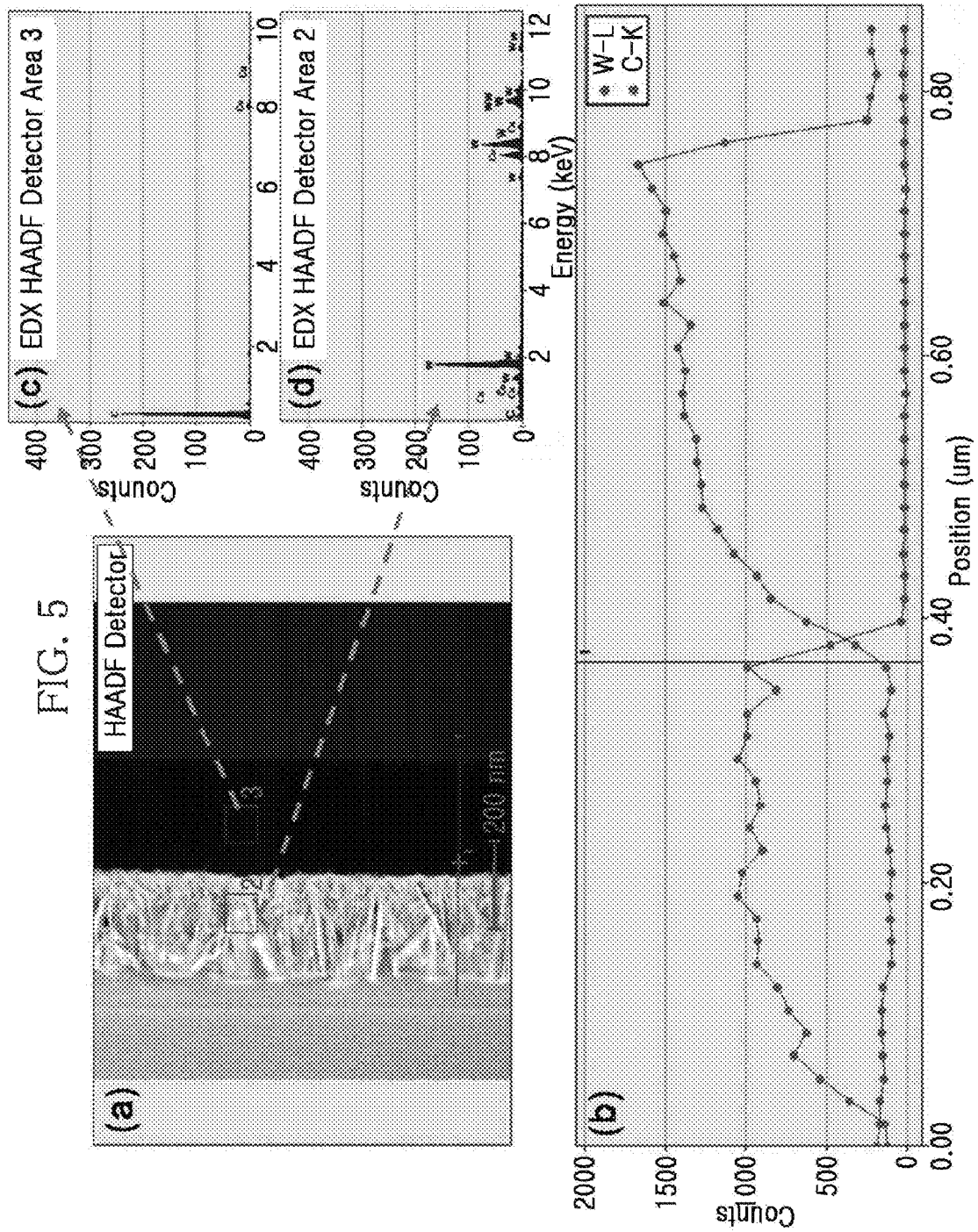
FIG. 5 (a) shows a cross-sectional high angle annular dark field (HAADF) image of nanowall-structured tungsten carbide grown on an NCD film, FIG. 5 (b) shows profiles of tungsten and carbon in a sample along the red line (1) in FIG. 5 (a), and FIGS. 5 (c) and (d) respectively show energy dispersive x-ray (EDX) measurements of the NCD and the nanowall.

A combination of energy dispersive x-ray (EDX), electron energy loss spectra (EELS) and high angle annular dark field (HAADF) provides detailed information on the electronic structure, crystalline structure, chemistry and composition of nanostructures. FIG. 5 (a) shows a cross-sectional HAADF image of the nanowall-structured tungsten carbide sample grown on the NCD film. K-edge and L-edge weights were used for elemental analysis. FIG. 5 (b) shows profiles of tungsten and carbon in the sample along the red line (1) in FIG. 5 (a). The red line 1 crosses the two layers. FIGS. 5 (c) and (d) respectively show EDX measurements of the NCD and the nanowall.

Figure 6:
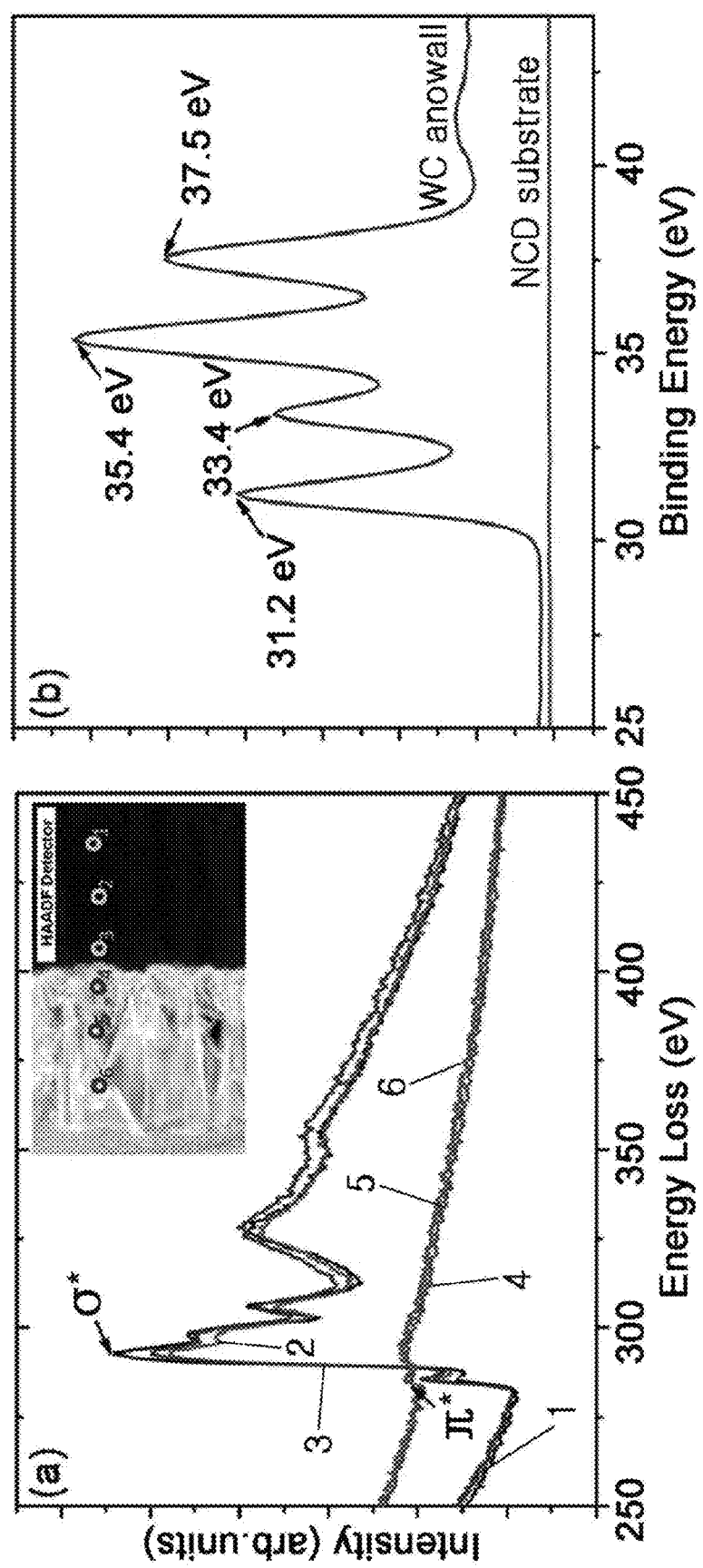
FIG. 6 (a) shows carbon K-edge electron energy loss (EEL) spectra obtained at different positions spanning NCD and nanowall layers in an HAADF image and FIG. 6 (b) shows an XPS analysis result for the nanowall and the NCD film.

EELS in TEM is employed to identify different structures present in a nano-sized film. FIG. 6 (a) shows carbon K-edge EEL spectra 1, 2, 3, 4, 5, 6 obtained at different positions $O_1$, $O_2$, $O_3$, $O_4$, $O_5$, $O_6$ spanning the NCD and nanowall layers in the HAADF image. Referring to FIG. 6 (a), the fine structure of the C-K edge of the EEL spectra from the NCD film exhibits peaks at ~290 eV corresponding to $\sigma^*$ states, which is a typical feature of diamond. By contrast, the EEL spectra taken from the nanowall exhibited a relatively less pronounced peak around ~285 eV, corresponding to the $\pi^*$ state, indicating smaller fraction of carbon relative to that of the NCD film. The EELS peaks of the NCD film appeared above 290 eV. This result is similar to that of diamond and is different from that of amorphous carbon or graphite.

The chemistry of the nanowall structure was further identified by XPS analysis. FIG. 6 (b) shows the XPS analysis result for the nanowall and the NCD film. It can be seen that metallic tungsten (W) and tungsten-carbon (W—C) bonds are present together in the nanowall structure.

The geometric transformation of 2-dimensional nanostructured tungsten carbide has never been studied so far. The inventors of the present disclosure investigated the effect of temperature on the geometric transformation. It was found that the influx of growth species and the degree of supersaturation are determined by temperature and the geometric shape of the grown tungsten carbide changes accordingly thereto.

Figure 7:
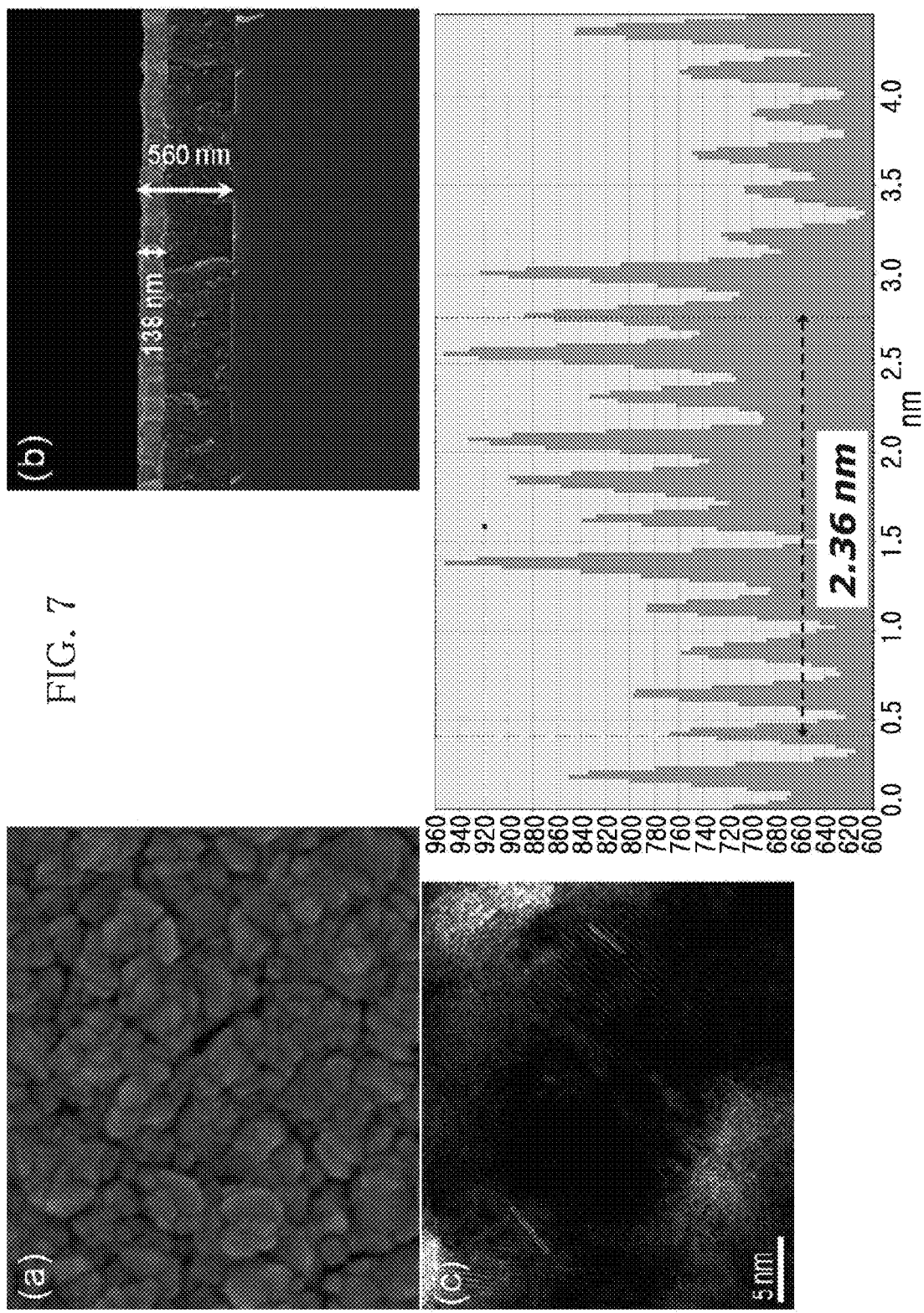
FIG. 7 shows SEM, HR-TEM and HR-TEM images and a line scan result of tungsten carbide prepared according to a second condition in Example 2.

FIG. 7(a) shows a plan-view SEM image of the tungsten carbide prepared according to the second condition in Example 2. In contrast to the sample prepared under the first condition, no nanowall structure was observed but a polycrystalline film with an average grain size of 30 to 40 nm was observed. And, referring to FIG. 7 (b), the thickness of the grown tungsten carbide film and the underlying NCD was 138 nm and 422 nm, respectively. FIG. 7(c) shows an HR-TEM image of the sample surface prepared under the second condition and FIG. 7 (d) shows a line scan result of the HR-TEM image of FIG. 7 (c). Referring to FIG. 7 (d), the inter-planar spacing was 2.36 Å, which corresponds to the (0002) plane of the $\alpha$-$W_2C$ phase.

The 2-dimensional nanostructured tungsten carbide and method for fabricating same according to the present disclosure provide the following advantageous effects.

Nanowall-structured tungsten carbide may be prepared by a chemical vapor deposition process wherein a hydrogen plasma is applied. Since the geometric shape of the tungsten carbide may be selectively changed by controlling the degree of supersaturation at the growth front, nanowall-structured tungsten carbide applicable to various technical fields may be prepared easily.

While the present disclosure has been described with respect to the specific embodiments, it will be apparent to those skilled in the art that various changes and modifications may be made without departing from the spirit and scope of the disclosure as defined in the following claims.

What is claimed is:

1. A method for fabricating 2-dimensional nanostuctured tungsten carbide vertically aligned on a nanocrystalline diamond film by chemical vapor deposition process, wherein the chemical vapor deposition process comprises:
    disposing a substrate with the nanocrystalline diamond film formed thereon on an anode in a chamber;
    disposing a surface-carburized tungsten cathode at a distance from the substrate; and
    applying hydrogen plasma into the chamber.

2. The method according to claim 1, comprising controlling a supersaturation degree of the growth species to control a geometric shape of the tungsten carbide formed on the nanocrystalline diamond film.

3. The method according to claim 2, wherein the degree of supersaturation is controlled by controlling the influx of growth species onto the nanocrystalline diamond film.

4. The method according to claim 3, wherein the influx of the growth species is controlled by controlling temperature and/or discharge voltage and current in generation of the hydrogen plasma.

5. The method according to claim 1, wherein the surface-carburized tungsten cathode is obtained by exposing a tungsten cathode to a carbon atmosphere of a predetermined temperature such that a carburized layer is formed up to a predetermined depth from the surface and the carburized layer has a $WC_x$ structure.

6. The method according to claim 1, wherein the surface-carburized tungsten cathode is disposed above the substrate.

7. The method according to claim 1, wherein the chemical vapor deposition process is controlled such that the tungsten carbide formed on the nanocrystalline diamond film has a nanowall structure.

* * * * *